US006532165B1

(12) United States Patent
Katori

(10) Patent No.: US 6,532,165 B1
(45) Date of Patent: Mar. 11, 2003

(54) NONVOLATILE SEMICONDUCTOR MEMORY AND DRIVING METHOD THEREOF

(75) Inventor: Kenji Katori, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/580,541

(22) Filed: May 30, 2000

(30) Foreign Application Priority Data

May 31, 1999 (JP) .......................................... 11-151856
May 31, 1999 (JP) .......................................... 11-151857

(51) Int. Cl.[7] ................................................ G11C 11/22
(52) U.S. Cl. .............. 365/145; 365/185.05; 365/185.29
(58) Field of Search ............................ 365/145, 185.11, 365/185.05, 161, 185.29, 185.14

(56) References Cited

U.S. PATENT DOCUMENTS

| | | | | |
|---|---|---|---|---|
| 5,303,182 A | | 4/1994 | Nakao et al. | 365/145 |
| 5,345,415 A | | 9/1994 | Nakao et al. | 365/145 |
| 5,535,154 A | | 7/1996 | Kiyono | 365/145 |
| 5,723,885 A | | 3/1998 | Ooishi | 257/295 |
| 5,751,037 A | * | 5/1998 | Aozasa et al. | 257/315 |
| 5,808,339 A | * | 9/1998 | Yamagishi et al. | 257/316 |
| 6,049,110 A | | 4/2000 | Koh | 257/347 |
| 6,054,734 A | * | 4/2000 | Aozasa et al. | 257/315 |
| 6,306,691 B1 | | 10/2001 | Koh | 438/149 |

FOREIGN PATENT DOCUMENTS

| | | | |
|---|---|---|---|
| JP | 5-136377 | | 6/1993 |
| JP | 5-136378 | | 6/1993 |
| JP | 7-161854 | | 6/1995 |
| JP | 7-183401 | | 7/1995 |
| JP | 8-335645 | | 12/1996 |
| JP | 09116036 A | * | 5/1997 |
| JP | 10-12887 | | 1/1998 |

* cited by examiner

*Primary Examiner*—Vu A. Le
*Assistant Examiner*—Hien Nguyen
(74) *Attorney, Agent, or Firm*—Rader, Fishman & Grauer PLLC; Ronald P. Kananen, Esq.

(57) ABSTRACT

In NAND type nonvolatile semiconductor memory each memory cell is made of a dual gate transistor connected at one gate portion thereof to ferroelectrics, a plurality of such memory cells are connected in series to form a memory block, and a plurality of such memory blocks are arranged to form a memory cell array and make up NAND type nonvolatile semiconductor memory. Used as each dual gate transistor is a thin film transistor which has a first gate formed on one surface of a semiconductor thin film via a first gate insulating film and a ferroelectric thin film, and a second gate electrode formed on the other surface of the semiconductor thin film via second gate insulating film in confrontation with the first gate electrode. Alternatively, ferroelectric gate type dual gate thin film transistors are made by forming thin film transistors on opposite surfaces of a ferroelectric thin film to form memory cells.

20 Claims, 15 Drawing Sheets

NONVOLATILE SEMICONDUCTOR MEMORY AND DRIVING METHOD THEREOF

BACKGROUND OF THE INVENTION

1. Field of the Invention

This invention relates to nonvolatile semiconductor memory using ferroelectrics, and its driving method.

2. Description of the Related Art

A ferroelectric memory is a kind of nonvolatile memory enabling quick rewriting by using quick polarization inversion of a ferroelectric thin film and its residual polarization. There are some types of ferroelectric memory, i.e. a type using a ferroelectric capacitor (FeRAM type) and a type connecting ferroelectrics to a gate portion of a transistor (ferroelectric gate type). The ferroelectric gate type is superior in terms of its cell area and non-destructive read-out mode. As this ferroelectric gate type nonvolatile memory, there are known MFS (Metal-Ferroelectrics-Semiconductor) type memory and, MFIS (Metal-Ferroelectrics-Insulator-Semiconductor) type memory and MFMIS (Metal-Ferroelectrics-Metal-Insulator-Semiconductor) type memory.

Although the ferroelectric gate type nonvolatile memory is advantageous in being excellent in terms of its cell area and non-destructive read-out mode, since a one-transistor type operates in a simple matrix driving mode upon polarization inversion of the ferroelectrics, it involves the problem of "disturbance" which is a phenomenon that polarization of the ferroelectrics of selected memory cells exerts its influence also to the ferroelectrics of non-selected memory cells. That is, FIG. 1 shows a part of a memory cell array of one-transistor type ferroelectric gate type nonvolatile memory. MC11', MC12', MC21' and MC22' are memory cells made of ferroelectric gate type transistors. B1a', B1b', B2a' and B2b' are bit lines. W1' and W2' are word lines. In this example, it operates in a simple matrix write mode, a disturb voltage of −Vw/3 (where Vw is a voltage necessary for polarization inversion of the ferroelectrics) is applied to the gate every time when data is written in other memory cells. In this case, data can be written with a lower voltage in a shorter time than with a flash memory configured to inject electric charges into floating gates. However, this is a reason of its weakness against the disturbance. Further, for The purpose of suppressing the disturb voltage to −Vw/3, it is necessary to render transistors of non-selected memory cells conductive as well to make a channel. Therefore, the extent of changes of the threshold voltage by the ferroelectrics is greatly limited, and the extent of characteristics the ferroelectrics are required to have is narrow. Furthermore, since it needs wiring connection to the source region and the drain region for each transistor of a a memory cell, the cell area increases as compared with a NAND type memory, and microminiaturized processing of the ferroelectrics is required. Therefore, its ferroelectric property deteriorates, and this makes it difficult to use ferroelectric materials, such as SBT, which are difficult to process by dry etching such as reactive ion etching (RIE).

The problem of the disturbance mentioned above can be overcome by adding selection transistors to memory cells. In this case, however, the cell area increases, and difficulty of high integration arises as a new problem.

On the other hand, flash memory is known as a kind of nonvolatile memory. Flash memory is configured to store information by injection and drawing of electrons to and from floating gates. Flash memory needs a larger voltage and a longer time for injection of electrons than polarization inversion of ferroelectrics, but this alleviates the disturbance problem. As a kind of flash memory, there has been developed NAND type memory having a small cell area and arranging a plurality of transistors in series to enable high integration.

Since ferroelectric gate type nonvolatile memory has a basic structure similar to that of flash memory, it is expected that the cell area decreases when the NAND type is employed. However, because of the above-indicated problem of disturbance and difficulty of ON/OFF control of transistors without polarization inversion, and because the directions of gate voltage application and changes of the threshold voltage are opposite from those of flash memory, NAND type cell arrangement has been difficult heretofore in ferroelectric gate type nonvolatile memory.

Japanese Patent Laid-Open Publication No. Hei 5-136377 and Japanese Patent Laid-Open Publication No. Hei 5-136378 propose NAND type nonvolatile memory devices. However, these NAND type nonvolatile semiconductor memory devices have extremely complicated structures which are considered difficult to realize.

OBJECTS AND SUMMARY OF THE INVENTION

It is therefore an object of the invention to provide nonvolatile semiconductor memory enabling realization of NAND type nonvolatile semiconductor memory of high integration, quick operation, low power consumption and less disturbance, and a driving method thereof.

According to the first aspect of the invention, there is provided nonvolatile semiconductor memory characterized in that each memory cell is made of a dual gate transistor in which a ferroelectric is connected to one of gate portions thereof, a plurality of the memory cells are connected in series to form a memory block, and a plurality of the memory blocks are arranged to form a memory cell array.

In the first aspect of the invention, the memory block is typically made by connecting a plurality of memory cells in series and connecting a selection transistor at least at one end of the serial connection of the memory cells. The number of memory cells forming the memory block is basically arbitrary, and as the number of memory cells increases, they will be highly integrated. In this case, however, the path for the current flowing through transistors of the memory cells becomes longer, and this invites a voltage drop. Therefore, an optimum number of memory cells is selected depending upon the use of the nonvolatile semiconductor memory. One end of the memory block is connected to bit lines typically through the selection transistor. A dual gate transistor forming a memory cell is typically a thin-film transistor. More specifically, the dual gate transistor is a thin film transistor having, for example, a first gate electrode formed on one surface of a semiconductor via a first gate insulating film and a ferroelectric thin film, and a second gate electrode formed on the opposite surface of the semiconductor thin film via a second gate insulating film so as to oppose to the first gate electrode. In this case, the dual gate transistor forming the memory cell is switched by changing the voltage of the second gate electrode. The ferroelectric thin film extends continuously over the area of a plurality of memory cells, typically over the entire area of the memory cell array.

According to the second aspect of the invention, there is provided a method for driving a nonvolatile semiconductor memory in which each memory cell is made of a dual gate transistor in which ferroelectric is connected to one of a plurality of gate portions thereof, a plurality of the memory cells are connected in series to form a memory block, a plurality of the memory blocks are arranged to form a memory cell array, and each dual gate transistor is a thin film transistor having a first gate electrode formed on one surface of a semiconductor thin film via a first gate insulating film and a ferroelectric thin film, and a second gate electrode formed on the other surface of the semiconductor thin film via a second gate insulating film in a location opposed to the first gate electrode, comprising:

- for an erasing operation, making uniform the direction of polarization of the ferroelectric thin film;
- for a writing operation, making conduction of the dual gate transistors forming a plurality of the serially connected memory cells of the memory block selected through a selection transistor connected to a bit line by the second gate electrode, and inverting polarization of a part of the ferroelectric connected to the gate portion of the dual gate transistor forming one of the memory cells at a crossing point of the memory block and a selected word line thereby to write data; and
- for a read-out operation, making conduction of the dual gate transistors forming memory cells except the selected memory cell of the selected memory block by the selection transistor connected to the bit line by the second gate electrode, and from the bit line current value at that moment, reading the as polarization direction of the ferroelectrics connected to the gate portion of the dual gate transistor forming the selected memory cell thereby to read out data.

According to the third aspect of the invention, there is provided a nonvolatile semiconductor memory characterized in that thin film transistors formed on opposite surfaces of a ferroelectric thin film form memory cells, respectively, a plurality of the memory cells are connected in series to make up a memory block, and a plurality of the memory blocks are arranged to form a memory cell array.

In the third aspect of the invention, the memory block is typically made by connecting a plurality of memory cells in series and connecting a selection transistor at least at one end of the serial connection of the memory cells. The number of memory cells forming the memory block is basically arbitrary, and as the number of memory cells increases, they will be highly integrated. In this case, however, the path for the current flowing through transistors of the memory cells becomes longer, and this invites a voltage drop. Therefore, an optimum number of memory cells is selected depending upon the use of the nonvolatile semiconductor memory. One end of the memory block is connected to bit lines typically through the selection transistor.

In the third aspect of the invention, in a typical version, a first gate electrode is formed on one surface of the ferroelectric thin film via a first gate insulating film, a first semiconductor thin film and a second gate insulating film; a first semiconductor region forming a source region or a drain region is formed in the first semiconductor thin film at opposite sides of the first gate electrode; a second gate electrode is formed on the other surface of the ferroelectric thin film via a third gate insulating film, a second semiconductor thin film and a fourth gate insulating film; and a second semiconductor region forming a source region or a drain region is formed in the second semiconductor thin film at opposite sides of the second gate electrode; the first semiconductor region formed in the first semiconductor thin film, the first gate electrode and a part of the ferroelectric thin film opposed to the first gate electrode constitute a first ferroelectric gate type dual gate thin film transistor forming the memory cell; and the second semiconductor region formed in the second semiconductor thin film, the second gate electrode and a part of the ferroelectric thin film opposed to the second gate electrode constitute a second ferroelectric gate type dual gate thin film transistor forming the memory cell. The ferroelectric thin film extends continuously over the area of a plurality of memory cells, typically over the entire area of the memory cell array.

From the viewpoint of improving the density of integration, a plurality of layers of the nonvolatile semiconductor memory may be stacked to share the first gate electrode or the second gate electrode.

According to the fourth aspect of the invention, there is provided a method for driving nonvolatile semiconductor memory in which a first gate electrode is formed on one surface of a ferroelectric thin film via a first gate insulating film, a first semiconductor thin film and a second gate insulating film; a first semiconductor region forming a source region or a drain region is formed in the first semiconductor thin film at opposite sides of the first gate electrode; a second gate electrode is formed on the other surface of the ferroelectric thin film via a third gate insulating film, a second semiconductor thin film and a fourth gate insulating film; and a second semiconductor region forming a source region or a drain region is formed in the second semiconductor thin film at opposite sides of the second gate electrode,

- the first semiconductor region formed in the first semiconductor thin film, the first gate electrode and a part of the ferroelectric thin film opposed to the first gate electrode constitute a first ferroelectric gate type dual gate thin film transistor forming a first memory cell; and the second semiconductor region formed in the second semiconductor thin film, the second gate electrode and a part of the ferroelectric thin film opposed to the second gate electrode constitute a second ferroelectric gate type dual gate thin film transistor forming a second memory cell, a plurality of the first memory cells are connected in series to form a first memory block; a plurality of the second memory cells are connected in series to form a second memory block; and a plurality of the first memory blocks and a plurality of the second memory blocks are arranged to form a memory cell array, comprising:
- for a writing operation, making conduction of the first ferroelectric gate type dual gate thin film transistors forming the serially connected first memory cells of the first memory block selected by a selection transistor connected to a bit line through the first gate electrode; and inverting polarization of a part of the ferroelectrics connected to the gate portion of the second ferroelectric gate type dual gate thin film transistor forming one of the first memory cells at a crossing point of the second memory block and a selected word line thereby to write data; and
- for a read-out operation, making conduction of the first ferroelectric gate type dual gate thin film transistors forming memory cells other than the selected memory cell of the first memory block selected by a selection transistor connected to a bit line, and reading dual gate transistors forming memory cells except the selected memory cell of the selected memory block by the selection transistor connected to the bit line by the second gate electrode, and from the bit line current value at that moment, reading the polarization direction of the ferroelectrics connected to the gate portion of the first ferroelectric gate type dual gate thin film transistor forming the selected memory cell thereby to read out data.

Japanese Patent Laid-Open Publication No. Hei 7-161854, Japanese Patent Laid-Open Publication No. 8-335645 and Japanese Patent Laid-Open Publication No. Hei 7-183401 propose ferroelectric gate type dual gate thin film transistors in which gate electrodes are located on opposite surfaces of a semiconductor thin film, and at least one of the gate electrodes is connected to a ferroelectric. However, they are not intended to be used as a NAND type nonvolatile memory. Further, Japanese Patent Laid-Open Publication No. Hei 10-12887 includes a description on an example using ferroelectrics for the purpose of applying a bias to a dual gate transistor. However, this example using ferroelectrics is not intended to hold the storage but used for application of a bias. Therefore, it is basically different from the present invention.

In the first and second aspects of the invention having the above-summarized structure, since each memory cell is made of a dual gate transistor in which a ferroelectric is connected to the portion of one of its gates, ON/OFF control of the transistor is possible by changing the gate voltage applied to the other gate electrode without changing the polarization direction of the ferroelectrics. Therefore, disturbance can be prevented, and NAND type arrangement of memory cells is possible. The NAND type arrangement need not provide wiring contact to the source region and the drain region in each memory cell individually. Therefore, the wiring space can be saved, and the cell area can be reduced. Additionally, polarization inversion of the ferroelectrics is very quick, and the voltage required for polarization inversion is much lower than the voltage required in flash memory to inject electrons into floating gates.

In the third and fourth aspects of the invention, since memory cells are made of thin-film transistors formed on opposite surfaces of a ferroelectric thin film, that is, ferroelectric gate type dual gate thin film transistors, by changing the gate voltage applied to the gate electrode of one of the ferroelectric gate type dual gate thin film transistors lying on one surface of the ferroelectric thin film, ON/OFF control of the ferroelectric gate type dual gate thin film transistor on the opposite surface of the ferroelectric thin film is possible without changing the polarization direction of the ferroelectrics. Therefore, while preventing disturbance, NAND type arrangement of memory cells is possible. The NAND type arrangement need not provide wiring contact to the source region and the drain region in each memory cell individually. Therefore, the wiring space can be saved, and the cell area can be reduced. Additionally, polarization inversion of the ferroelectrics is very quick, and the voltage required for polarization inversion is much lower than the voltage required in flash memory to inject electrons into floating gates.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
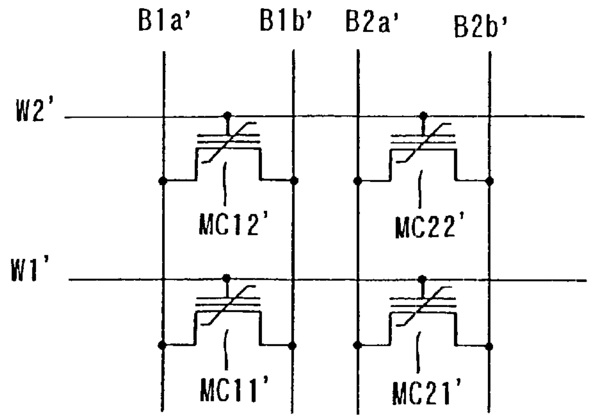
FIG. 1 is a circuit diagram showing one-transistor type ferroelectric gate type nonvolatile memory.

Explained below are embodiments of the invention with reference to the drawings. In all of the drawings showing the embodiments, the same or corresponding elements are labeled with common reference numerals.

Figure 2:
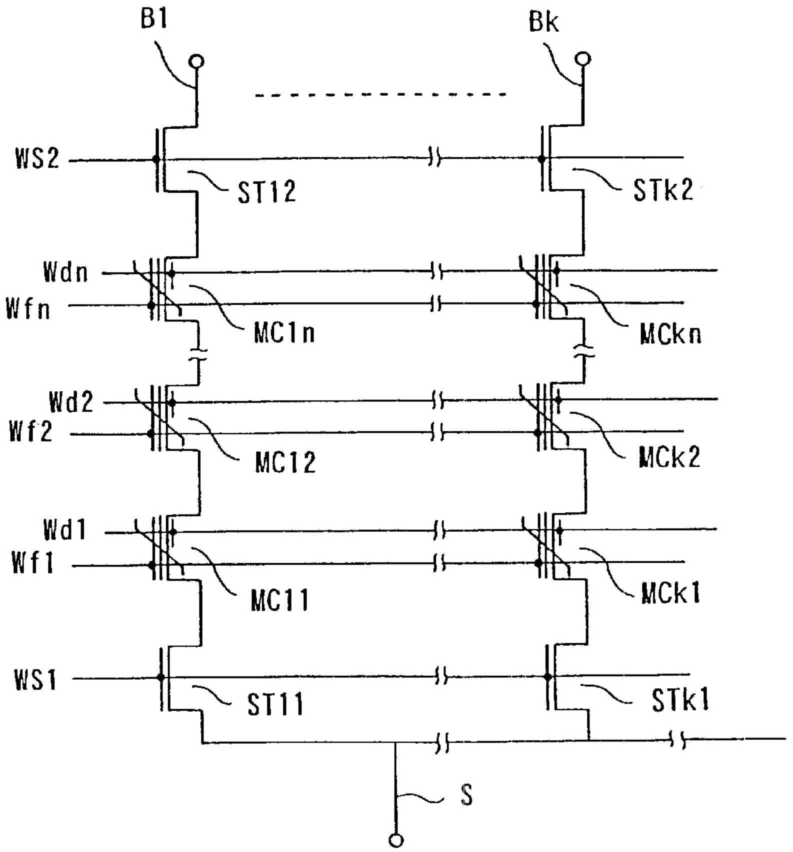
FIG. 2 is a circuit diagram showing NAND type nonvolatile semiconductor memory according to the first embodiment of the invention.

FIG. 2 is a circuit diagram of a memory cell array of NAND type nonvolatile semiconductor memory according to the first embodiment of the invention.

As shown in FIG. 2, in the NAND type nonvolatile semiconductor memory according to the first embodiment, a memory block is made of n memory cells connected in series and each made of a ferroelectric gate type dual gate thin film transistor with one of its gate portions being connected to ferroelectrics, and k memory blocks are arranged to form a memory cell array. MCij (where i=1~k, j=1~n) denotes a memory cell belonging to a No. i memory block. One end of the No. i memory block is connected to a common source line S via a selection transistor STi1, and the other end thereof is connected to a bit line B1 via a selection transistor STi2. These selection transistors STi1 and STi2 are made of normal thin film transistors each having a single gate electrode, instead of ferroelectric gate type dual gate thin film transistors.

Upper gate electrodes nearer to the ferroelectrics of ferroelectric gate type dual gate thin film transistors forming memory cells MCij in a common stage of all memory blocks and lower gate electrodes opposed to the upper gate electrodes are made of word lines Wfj and Wdj, respectively. Further, gate electrodes of selection transistors STi1 of all memory blocks are made of a common selection line WS1, and gate electrodes of the selection transistors STi2 are made of a common selection line WS2.

Next explained is a concrete structure of the NAND type nonvolatile semiconductor memory according to the first embodiment.

Figure 3:
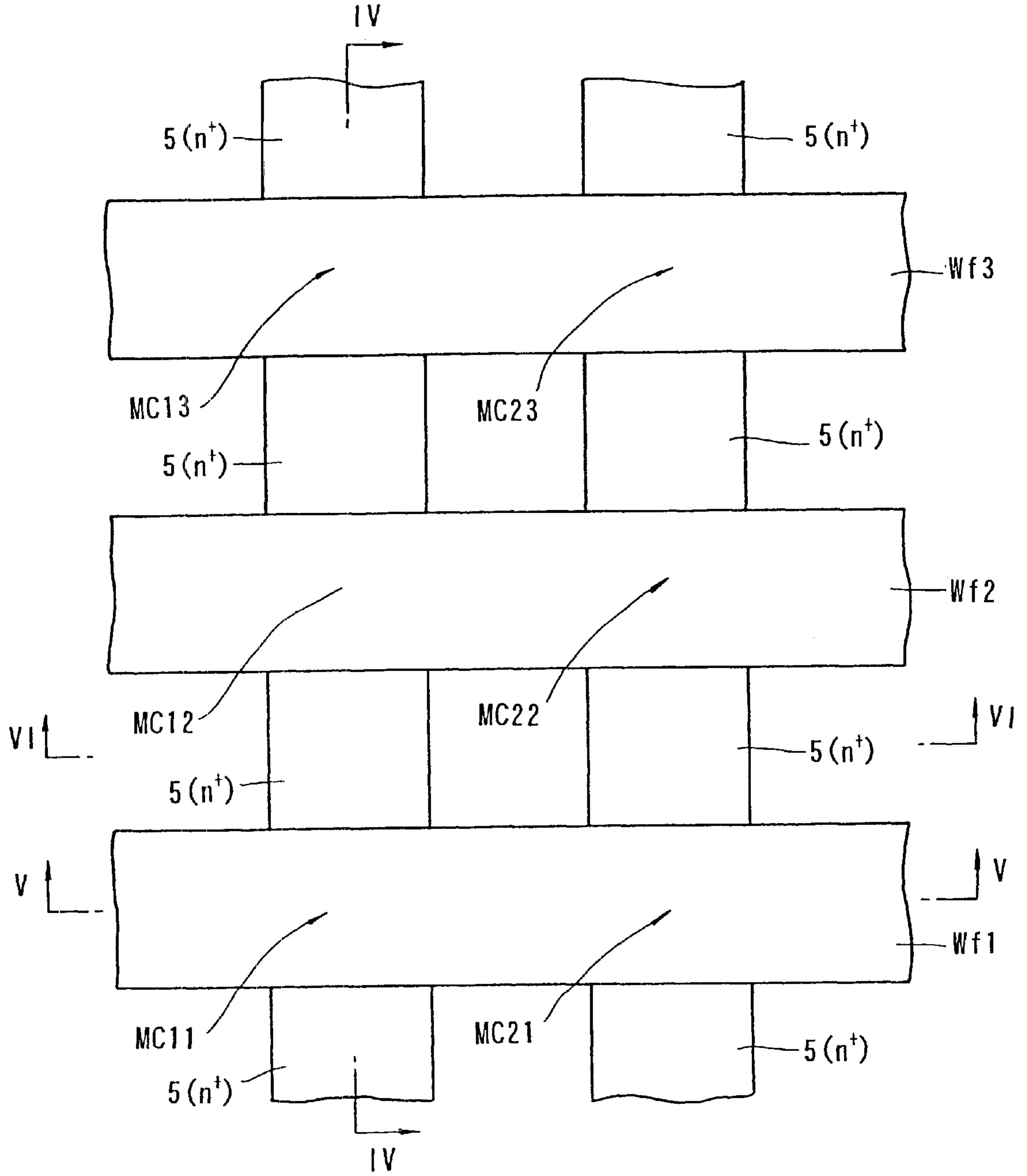
FIG. 3 is a plan view showing configuration of a part of the memory cell array of the NAND type nonvolatile semiconductor memory according to the first embodiment of the invention.
Figure 4:
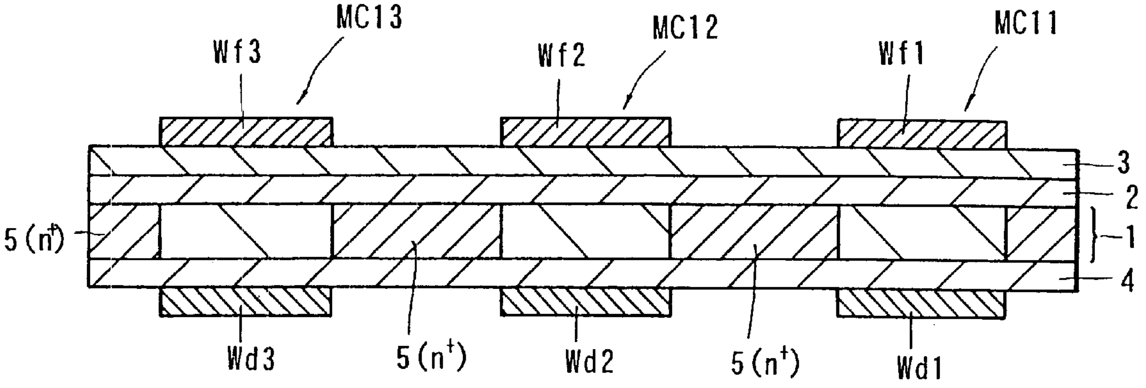
FIG. 4 is a cross-sectional view taken along the IV—IV line of FIG. 3.
Figure 5:
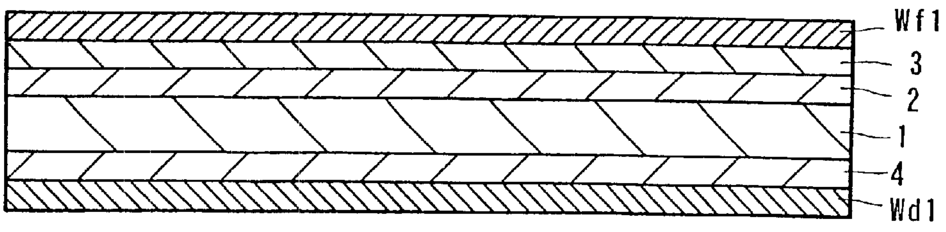
FIG. 5 is a cross-sectional view taken along the V—V line of FIG. 3.
Figure 6:
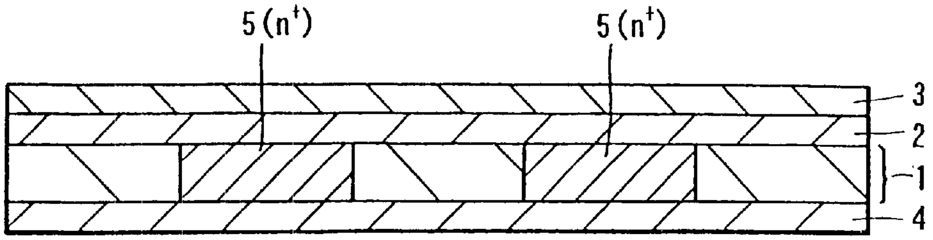
FIG. 6 is a cross-sectional view taken along the VI—VI line of FIG. 3.

FIG. 3 is a plan view showing a part of the memory cell array. FIG. 4 is a cross-sectional view taken along the IV—IV line of FIG. 3. FIG. 5 is a cross-sectional view taken along the IV—IV line of FIG. 3. FIG. 6 is a cross-sectional view taken along the V—V line of FIG. 3.

As shown in FIGS. 3, 4, 5 and 6, word lines Wfj are formed on one surface of a semiconductor thin film 1 via a gate insulating film 2 and a ferroelectric thin film 3, and word lines Wdj are formed on the opposite surface of the semiconductor thin film 1 via a gate insulating film 4 so as to oppose to the word lines Wfj. In the semiconductor thin film 1, $n^+$-type regions 5 forming source regions and drain regions of ferroelectric gate type dual gate tin film transistors are provided in regions between every adjacent word lines Wfj. The semiconductor thin film 1 is a p-type region excluding the $n^+$-type regions 5, and the p-type regions sandwiched by opposed word lines Wfj and Wdj form channel regions.

The semiconductor thin film 1 is a polycrystalline Si thin film, for example. The gate insulating films 2, 4 are made of an insulating material such as $SiO_2$, SiN, $CeO_2$, $Al_2O_3$, and $Ta_2O_5$, for example. These gate insulating films 2 and 4 extend continuously all over one and the other surfaces of the semiconductor thin film 1. The ferroelectric thin film 3 is made of ferroelectrics like SBT or PZT, for example. The ferroelectric thin film 3 extends continuously all over the memory cell array. The word lines Wfi and Wdi are made of polycrystalline Si, Ta, W, etc. for example.

In an example of the NAND type nonvolatile semiconductor memory according to the first embodiment, the gate insulting films 2, 4 are 6 nm thick $SiO_2$ films, and the ferroelectric thin film 3 is a 60 nm thick SBT film. This SBT has coercive field $E_c$ of $6\times10^4$ V/cm, residual polarization $P_r$ of 7 $\mu C/cm^2$, and relative dielectric constant of 200. Ferroelectric coercive voltage $V_c$ is 0.36V, ferroelectric inversion voltage $2V_c$ is 0.72 V, and cell inversion voltage is 4.4 V. The extent of changes in threshold voltage $V_{th}$ of the ferroelectric gate type dual gate thin film transistor is ±2.4 V.

Next explained is a manufacturing method of the NAND type nonvolatile semiconductor memory having the above-explained structure according to the first embodiment with reference to FIGS. 7 through 12 which are cross-sectional views corresponding to the cross-sectional view of FIG. 4.

Figure 7:
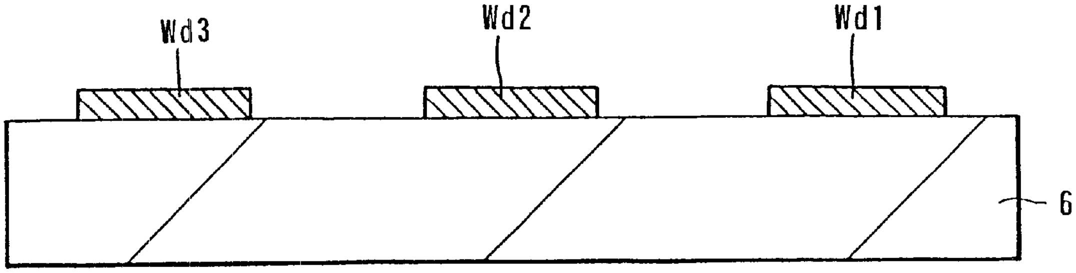
FIG. 7 is a cross-sectional view for explaining a manufacturing method of the NAND type nonvolatile semiconductor memory according to the first embodiment of the invention.

First as shown in FIG. 7, a film of polycrystalline Si, Ta, W, etc. is formed on a support substrate 6, and this film is patterned into a predetermined geometry to form word lines Wdj.

Figure 8:
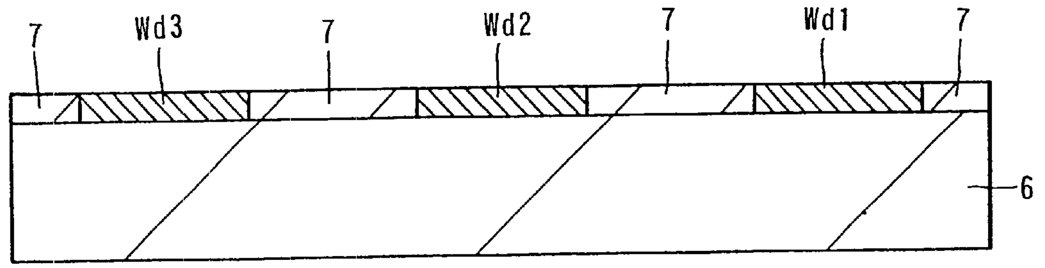
FIG. 8 is a cross-sectional view for explaining a manufacturing method of the NAND type nonvolatile semiconductor memory according to the first embodiment of the invention.

Next as shown in FIG. 8, recesses between the word lines Wdj are buried with a smoothing film 7 to smooth the surface.

Figure 9:
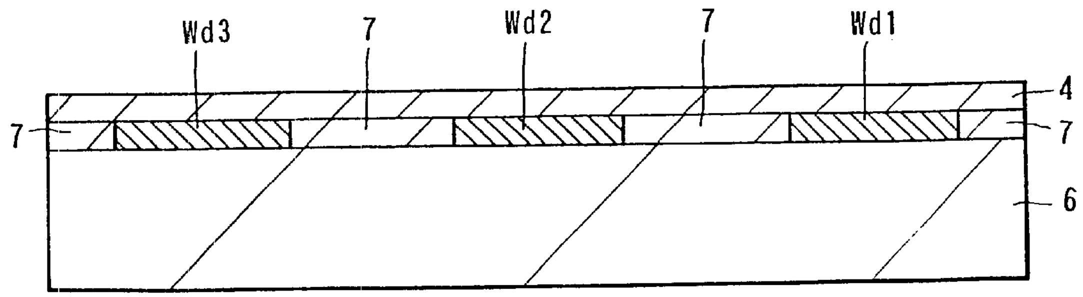
FIG. 9 is a cross-sectional view for explaining a manufacturing method of the NAND type nonvolatile semiconductor memory according to the first embodiment of the invention.

Next as shown in FIG. 9, stacked on the smoothed surface is the gate insulating film 4 of $SiO_2$, SiN, $CeO_2$ or $Al_2O_3$, for example.

Figure 10:
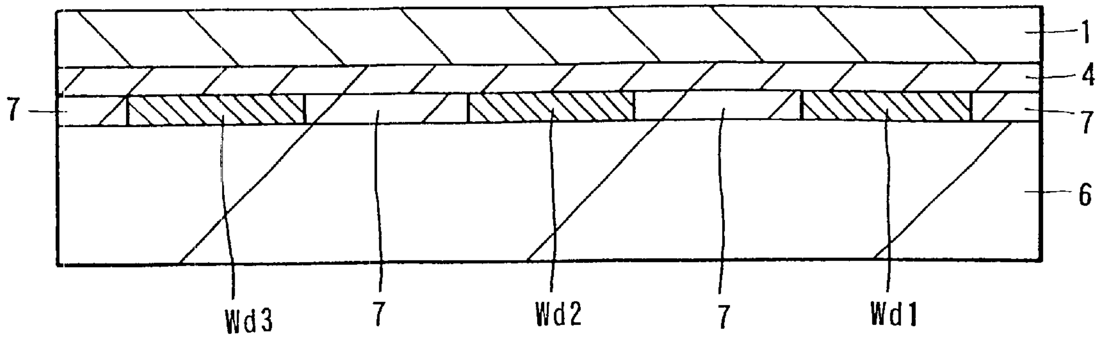
FIG. 10 is a cross-sectional view for explaining a manufacturing method of the NAND type nonvolatile semiconductor memory according to the first embodiment of the invention.

Next as shown in FIG. 10, the semiconductor thin film 1 is stacked on the gate insulating film 4.

Figure 11:
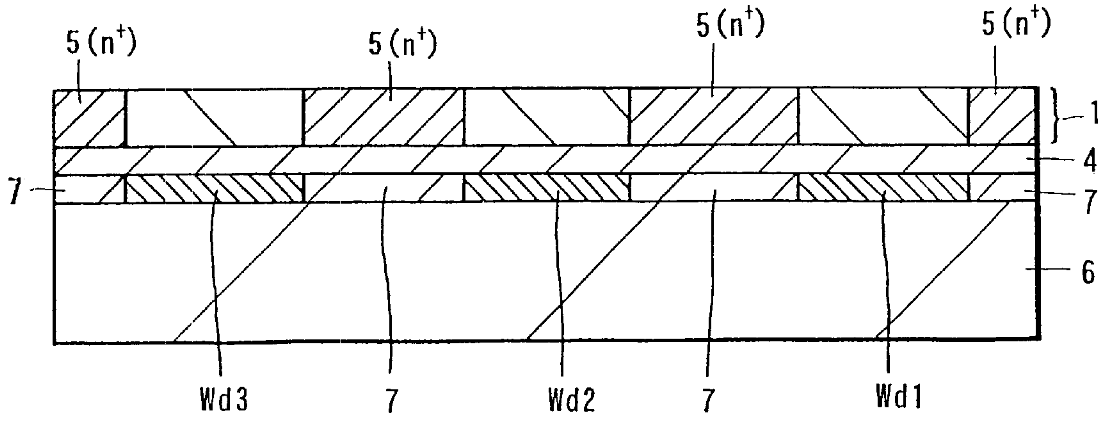
FIG. 11 is a cross-sectional view for explaining a manufacturing method of the NAND type nonvolatile semiconductor memory according to the first embodiment of the invention.

Next as shown in FIG. 11, an n-type impurity is selectively ion-implanted into the semiconductor thin film 1, using a resist pattern (not shown), for example, as a mask, to form $n^+$-type regions 5.

Figure 12:
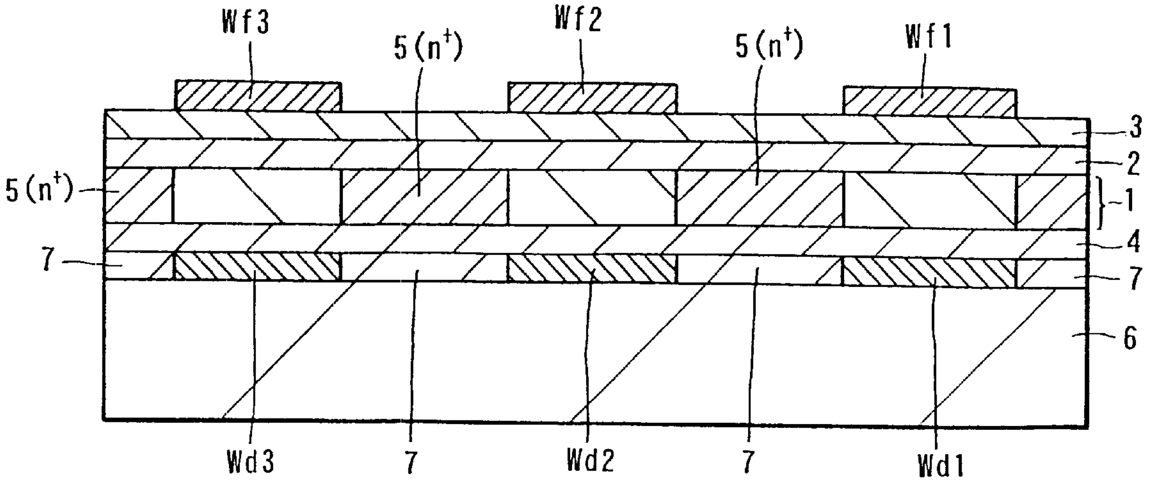
FIG. 12 is a cross-sectional view for explaining a manufacturing method of the NAND type nonvolatile semiconductor memory according to the first embodiment of the invention.

Next as shown in FIG. 12, after the gate insulating film 2 and the ferroelectric film 3 are sequentially stacked on the semiconductor thin film 1, selective portions of the ferroelectric thin film 3 other than the memory cell array portion are removed by etching. Then, in the same manner as the word lines Wdj, word lines Wfj are formed on the ferroelectric thin film 3 in the memory cell array portion, and selection lines WS1 and WS2 are formed on the gate insulating film 2 in the areas other than the memory cell array portion.

After that, the support substrate 6 and the smoothing film 7 are removed. As a result, as shown in FIGS. 3, 4, 5 and 6, intended NAND type nonvolatile semiconductor memory is obtained.

Next explained is a method of erasure, writing and reading of NAND type nonvolatile semiconductor memory according to the first embodiment.

Erasure is executed collectively for each memory block and not for each memory cell individually. Let the voltage necessary for polarization inversion of the ferroelectrics be $V_w$ (for example, 4.4 V). For executing erasure, $-V_w$ is applied to the word lines Wf1~Wfn. All of the word lines Wd1~Wdn and selection lines WS1, WS2 are set in 0 V. As a result, all of the ferroelectrics of memory cells within a memory block are uniformed in polarization direction, and the threshold voltage of the transistors forming the memory cells rises to $V_{th}E$ as shown at C in FIG. 13. This status is determined as data "0".

Writing is executed sequentially from the word line Wf1 to the word line Wfn in each memory block.

As an example, assume here that data "1" is to be written in the memory cell MC11 and data "0" is written-in the memory cell MCk1. In this case, setting the selection line WS1 in 0V to turn OFF the selection transistor STi1, and a voltage higher than the threshold voltage is applied to the selection line WS2 to turn ON the selection transistor STi2. Further, the bit line B1 connected to the memory block containing the memory-cell MC11 is set in 0V, and $V_w$ is applied to the bit line Bk connected to the memory block containing the memory cell MCk1. On the other hand, to all of the word lines Wd1~Wdn, a voltage $V_{th}E$ necessary for turning ON the transistors forming the memory cells is applied. Then, $V_w$ is applied to the word line Ff1 to which the memory cells MC11 and MCk1. In the memory cell MC11, therefore, since the channel region of the transistor forming this memory cell MC11 becomes 0V, polarization inversion of the ferroelectrics occurs, the threshold voltage of the transistor decreases to $V_{th}W$ as shown at A in FIG. 13, and data "1" is written. On the other hand, in the memory cell MCk1, since $V_w$ is applied to both the word line Wf1 and the channel region of the transistor forming the memory cell MCk1, electric fields in the upper and lower directions are canceled, polarization inversion of the ferroelectrics does not occur, and data "0" is maintained. In this manner, data is written simultaneously into all memory cells connected to the word line Wf1.

Figure 13:
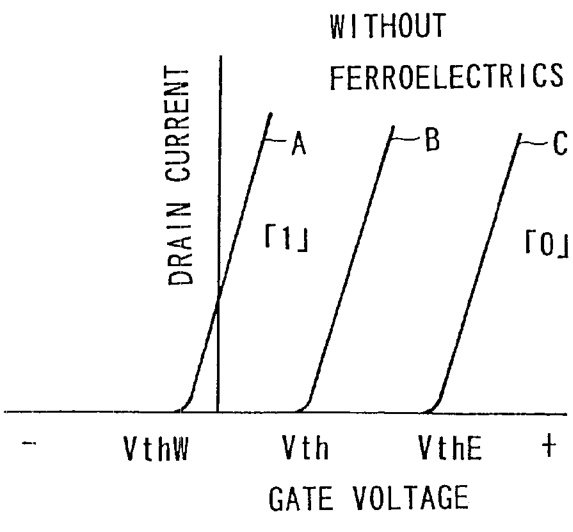
FIG. 13 is a diagram for explaining a method for operating the NAND type nonvolatile semiconductor memory according to the first embodiment of the invention.

Next made is a review about the case in which data "0" is written in the memory cell MC12 and data "1" is written in the memory cell MCk2. Here again, the selection line WS1 is set in 0V to turn OFF the selection transistor STi1, and the selection line WS2 is set in a voltage above the threshold voltage to turn ON the selection transistor STi2. To all of the selection lines Wd2~Wdn, the voltage $V_{th}E$ necessary for ho turning ON the transistors is applied. At that time, for the purpose of not applying the inversion voltage to memory cells on the word line Wf1 in which data is already written, $V_{th}W$ as shown at A of FIG. 13 is applied to the word line Wd1 to turn OFF the transistors forming these memory cells. Therefore, the bit line voltage is not applied to the memory cells on the word line Wf1, and the data already written therein is maintained. To the bit line B1, $V_w$ is applied, and the bit line Bk is set in 0V. Then, $V_w$ is applied to the word line Wf2. As a result, polarization inversion of the ferroelectrics occurs in the memory cell MCk2, and data "1" is written. On the other hand, in the memory cell MC12, since $V_w$ is applied also to the channel region of the transistor forming this memory cell MC12, electric fields in the upper and lower directions are canceled, polarization inversion of the ferroelectrics does not occur, and data "0" is maintained. In this manner, data is written simultaneously in all memory cells connected to the word line Wf2.

Thereafter, in the same manner, while turning OFF the transistors of the memory cells already written with data not to change the data, writing of data is progressed for every word line up to the word line Wfn.

By executing writing in this manner, writing with less disturbance is possible although it is not ID random writing.

In case of executing writing in any other memory block, the selection transistor STi2 is turned OFF to completely prevent disturbance.

Reading is executed in the following manner. For reading out data from memory cells connected to the bit line B1, for example, voltages above the threshold voltages are applied to the selection lines WS1, WS2 to turn ON the selection transistors ST11, ST12. First for reading out data from the memory cell MC11, $V_{th}E$ is applied to the word lines Wd2~Wdn to turn ON the transistors forming the memory cells MC1j (j=2~n). Then, a predetermined read-out voltage is applied to the bit line B1 to check the source-drain current, i.e. the current flowing in the bit line B1. If the current flows therein, data of the memory cell MC11 is "1". If the current does not flow, data of the memory cell MC11 is "0".

Next for reading out data from the memory cell MC12, $V_{th}E$ is applied to the word lines Wd1 and Wd3~Wdn to turn ON the transistors forming the memory cells MC11, MC1j (j=3~n). Then, a predetermined read-out voltage is applied to the bit line B1 to check the source-drain current, i.e. the current flowing in the bit line B1. If the current flows therein, data of the memory cell MC12 is "1". If the current does not flow, data of the memory cell MC12 is "0".

Thereafter, data can be read out from individual memory cells in the same manner. Thus, random access is possible upon reading.

As explained above, according to the first embodiment, by making each memory cell of a ferroelectric gate type dual gate thin film transistor, connecting a plurality of such memory cells in series to make up a memory block, and arranging a plurality of such memory blocks, it is possible to realize NAND type nonvolatile semiconductor memory of high integration, high speed and low power consumption and alleviated in the problem of disturbance which has been a drawback of conventional ferroelectric gate type nonvolatile memory. Additionally, since this embodiment does not need microminiaturized processing of the ferroelectric thin film 3 for each memory cell, the ferroelectric thin film 3 does not deteriorate in property, and the NAND type nonvolatile semiconductor memory can be manufactured easily.

Figure 14:
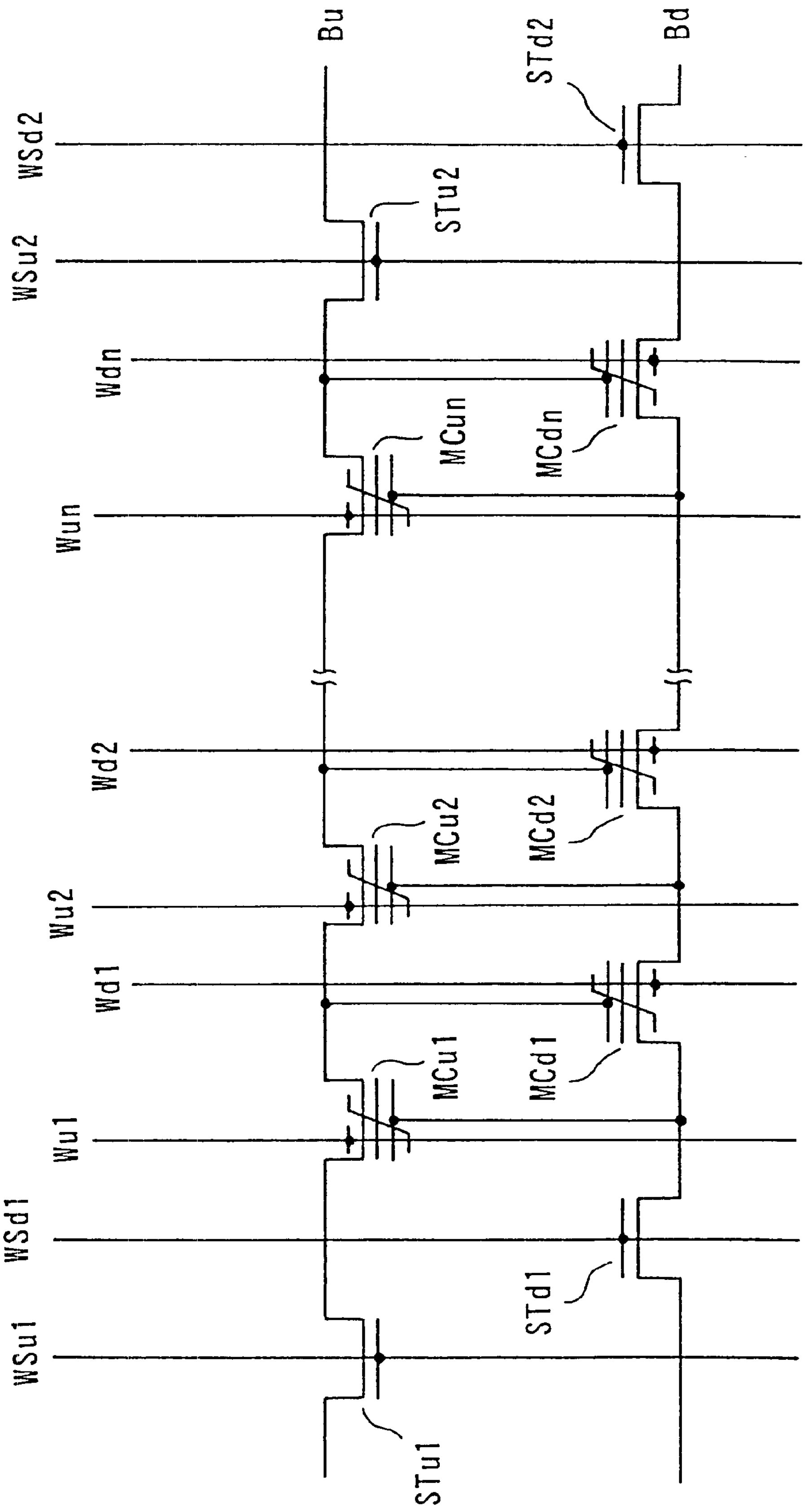
FIG. 14 is a circuit diagram showing NAND type nonvolatile semiconductor memory according to the second embodiment of the invention.

FIG. 14 is a circuit diagram of a memory cell array of NAND type nonvolatile semiconductor memory according to the second embodiment of the invention.

In the NAND type nonvolatile semiconductor memory according to the second embodiment, a pair of memory blocks are made of n memory cells connected in series and each made of ferroelectric gate type dual gate thin film transistors formed on opposite surfaces of a ferroelectric thin film forming a ferroelectric gate, and a plurality of paired memory blocks are arranged to form a memory cell array.

That is, as shown in FIG. 14, n memory cells MCui (where i=1~n) are connected in series on one surface of a ferroelectric thin film to form a memory block, and n memory cells MCdi (where i=1~n) are connected in series on the other surface of the ferroelectric thin film to form a memory block. One end of the memory block on one surface of the ferroelectric thin film is connected to a source line (not shown) via a selection transistor STu1, and the other end thereof is connected to a bit line Bu via a selection transistor STu2. One end of the memory block on the other surface of the ferroelectric thin film is connected to a source line via a selection transistor STd1, and the other end thereof is connected to a bit line Bd via a selection transistor STd2. These selection transistors STu1, STu2, STd1 and STd2 are made of normal thin film transistors each having a single gate electrode, instead of ferroelectric gate type dual gate thin film transistors.

Gate electrodes of the ferroelectric gate type dual gate thin film transistors forming memory cells in a common stage of all memory blocks on one surface of the ferroelectric thin film are made of word lines Wui. Similarly, gate electrodes of the ferroelectric gate type dual gate thin film transistors forming memory cells MCij of a common stage of all memory blocks on the other surface of the ferroelectric thin film are made of word lines Wdi. Further, gate electrodes of selection transistors STu1, STu2 in all memory blocks on one surface of the ferroelectric thin film are made of selection lines WSu1 and WSu2, respectively. Similarly, gate electrodes of selection transistors STd1, STd2 in all memory blocks on the other surface of the ferroelectric thin film are made of selection lines WSd1 and WSd2, respectively.

Next explained is a concrete structure of the NAND type nonvolatile semiconductor memory according to the second embodiment.

Figure 15:
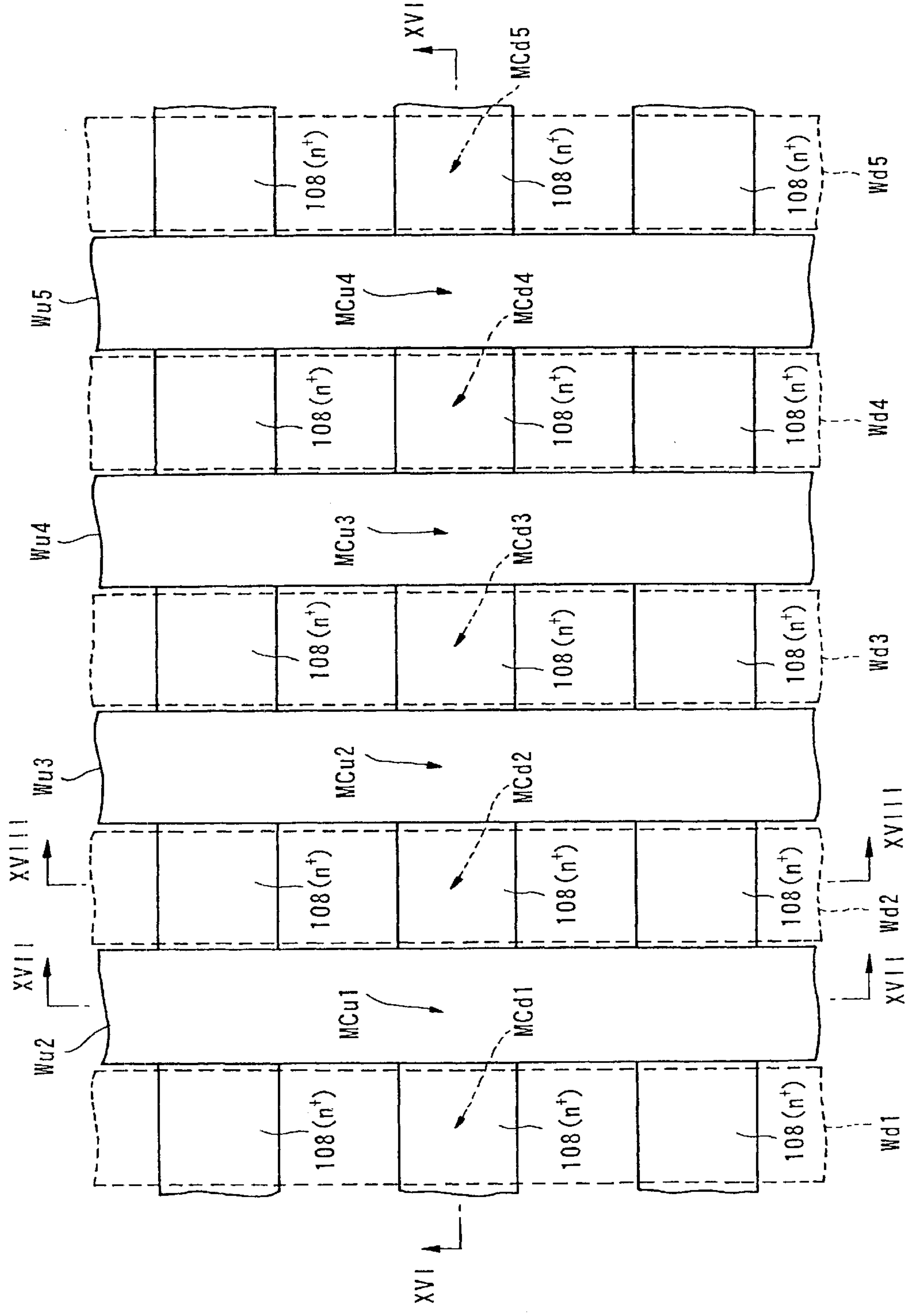
FIG. 15 is a plan view showing configuration of a part of the memory cell array of the NAND type nonvolatile semiconductor memory according to the second embodiment of the invention.
Figure 16:
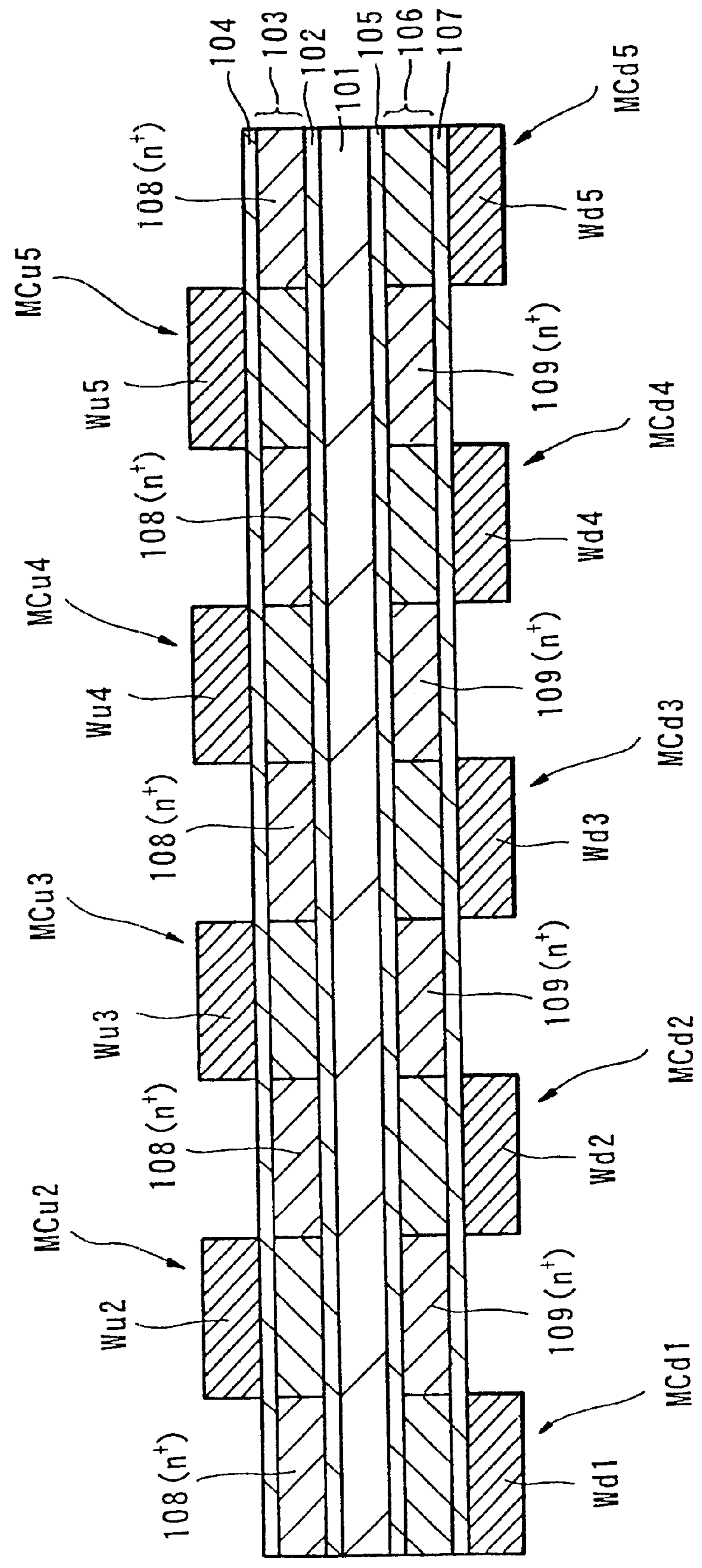
FIG. 16 is a cross-sectional view taken along the XVI—XVI line of FIG. 15.
Figure 17:
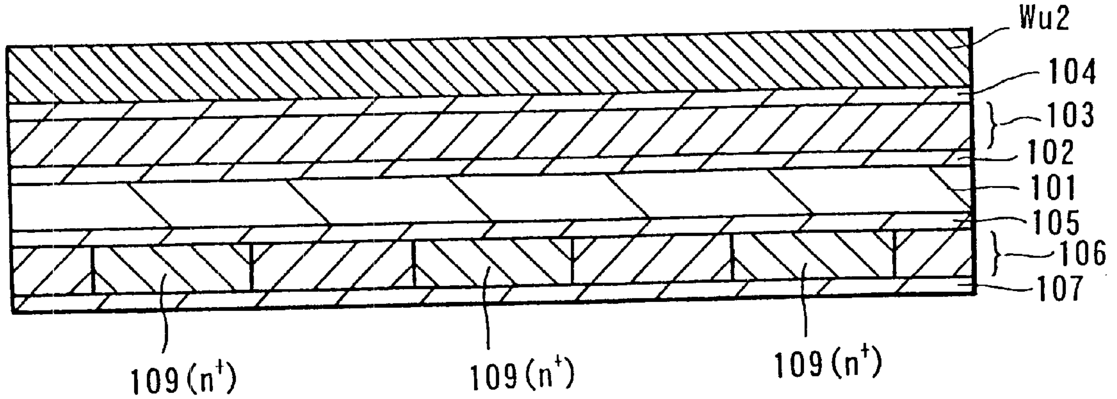
FIG. 17 is a cross-sectional view taken along the XVII—XVII line of FIG. 15.
Figure 18:
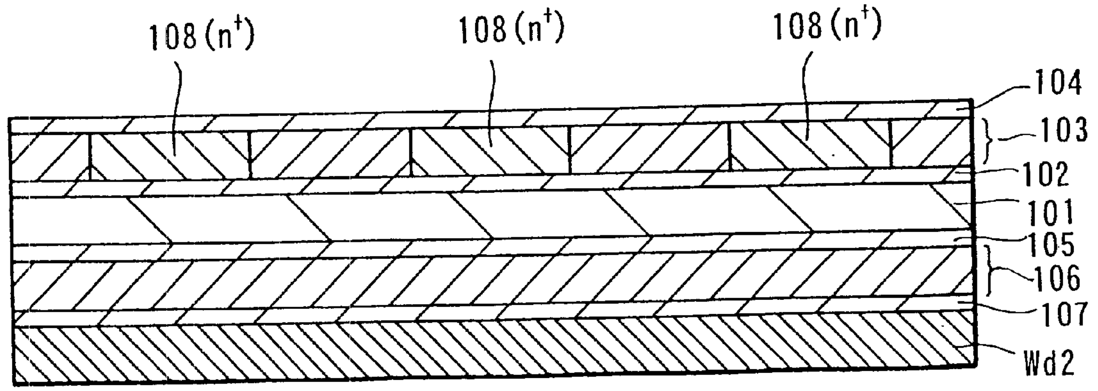
FIG. 18 is a cross-sectional view taken along the XVIII—XVIII line of FIG. 15.

FIG. 15 is a plan view showing a part of the memory cell array. FIG. 16 is a cross-sectional view taken along the XVI—XVI line of FIG. 15. FIG. 17 is a cross-sectional view taken along the XVII—XVII line of FIG. 15. FIG. 18 is a cross-sectional view taken along the XVIII—XVIII line of FIG. 15.

As shown in FIGS. 15, 16, 17 and 18, word lines Wui are formed to extend in parallel with each other on one surface of a ferroelectric thin film 101 via a gate insulating film 102, semiconductor thin film 103 and a gate insulating film 104, and word lines Wdi are formed to extend in parallel with the word lines Wui and in parallel with each other on the other surface of the ferroelectric thin film 101 via a gate insulating film 105, semiconductor thin film 106 and gate insulating film 107. In the semiconductor thin film 103, $n^+$-type regions 108 forming source regions and drain regions of ferroelectric gate type dual gate tin film transistors forming the memory cells MCui are provided in regions between every adjacent word lines Wui. The semiconductor thin film 103 is a p-type region excluding the $n^+$-type regions 108. In the semiconductor thin film 106, $n^+$-type regions 109 forming source regions and drain regions of ferroelectric gate type dual gate thin film transistors forming the memory cells MCdi are provided in regions between every adjacent word lines Wdi. The semiconductor thin film 106 is a p-type region excluding the $n^+$-type regions 109. Channel regions of the ferroelectric gate type dual gate thin film transistors forming the memory cells MCui and the $n^+$-type regions 109 are provided in corresponding locations, and the channel regions of the ferroelectric gate type dual gate thin film transistors forming the memory cells MCdi and the $n^+$-type regions 108 are provided in corresponding locations.

The ferroelectric thin film 101 is made of ferroelectrics like SBT or PZT, for example. The gate insulating films 102, 104, 105 and 107 are made of an insulating material such as $SiO_2$, SiN, $CeO_2$, $Al_2O_3$, and $Ta_2O_5$, for example. The semiconductor thin films 103 and 106 are polycrystalline Si thin films, for example. The word lines Wui and Wdi are made of polycrystalline Si, Ta or W, for example. Similarly, the selection lines WSu1, WSu2, WSd1 and WSd2 are made of polycrystalline Si, Ta or W, for example.

In an example of the NAND type nonvolatile semiconductor memory according to the second embodiment, the gate insulting films 102, 104, 105, 107 are 10 nm thick CeO, films, and the ferroelectric thin film 101 is a 60 nm thick SBT film. This SBT has coercive field $E_c$ of $6\times10^4$ V/cm, residual polarization $P_r$ of 7 $\mu C/cm^2$, and relative dielectric constant of 200. Ferroelectric coercive voltage $V_c$ is 0.36V, ferroelectric inversion voltage $2V_c$ is 0.72 V, and cell inversion voltage is 2.5 V. The extent of changes in threshold voltage $V_{th}$ of the ferroelectric gate type dual gate thin film transistor is ±2.4 V.

Next explained is a manufacturing method of the NAND type nonvolatile semiconductor memory having the above-explained structure according to the second embodiment with reference to FIGS. 19A through 19E which are cross-sectional views corresponding to the cross-sectional view of FIG. 16.

Figure 19A:
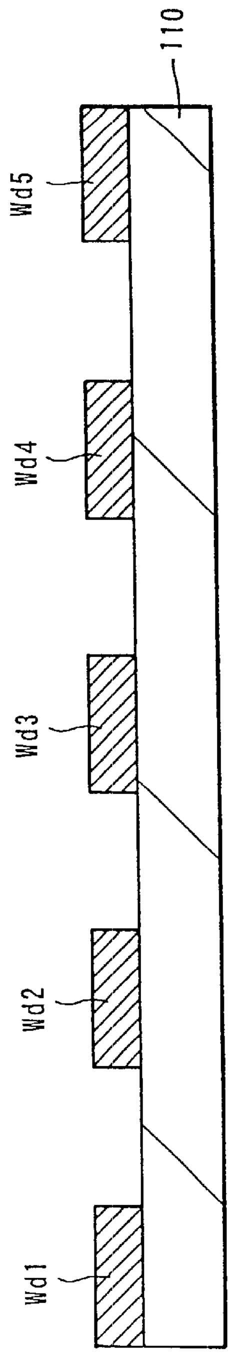
FIGS. 19A to 19E are cross-sectional views for explaining a manufacturing method of the NAND type nonvolatile semiconductor memory according to the second embodiment of the invention.

First as shown in FIG. 19A, a film of polycrystalline Si, Ta, W, etc. is formed on a support substrate 110, and this film is patterned into a predetermined geometry to form word lines Wdi.

Figure 19B:
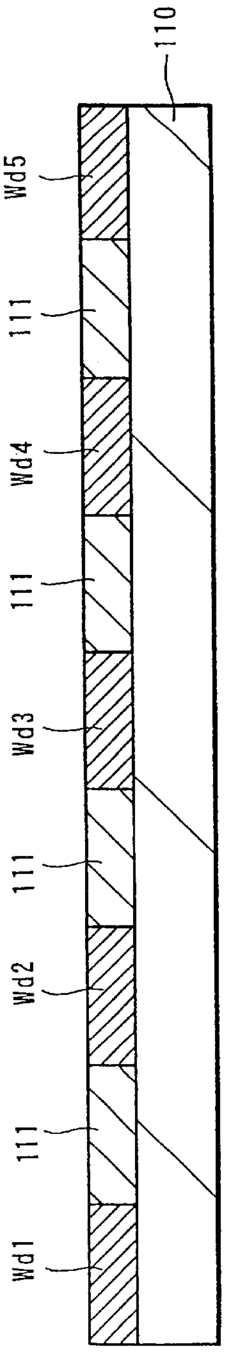

Next as shown in FIG. 19B, recesses between the word lines Wdi are buried with a smoothing film 111 to smooth the surface.

Figure 19C:
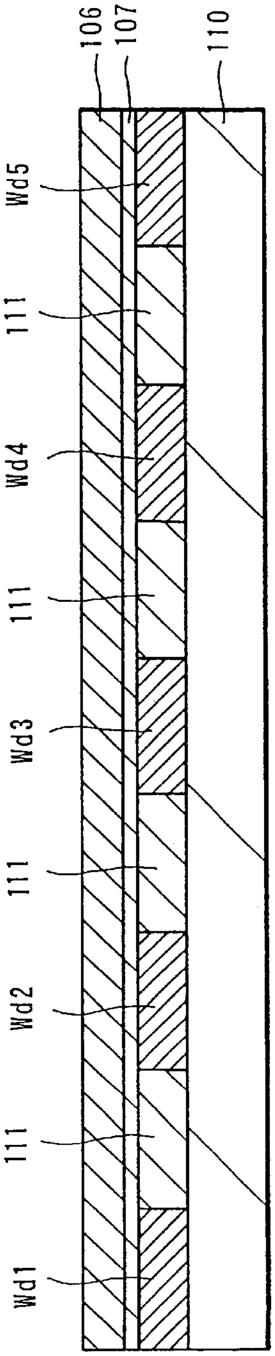

Next as shown in FIG. 19C, sequentially stacked on the smoothed surface are the gate insulating film 107 of $SiO_2$, SiN, $CeO_2$, $Al_2O_3$ or $Ta_2O_5$, for example, and the semiconductor thin film 106.

Figure 19D:
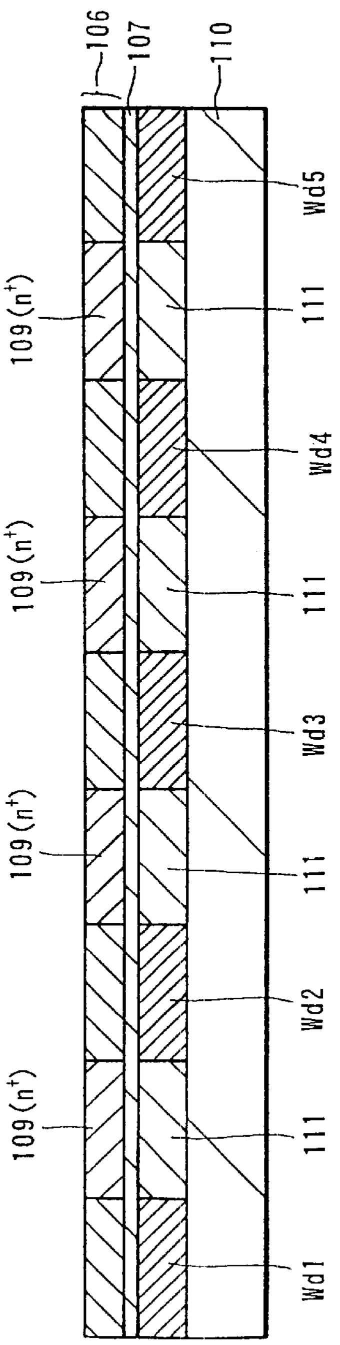

Next as shown in FIG. 19D, an n-type impurity is selectively ion-implanted into the semiconductor thin film 106, using a resist pattern (not shown), for example, as a mask, to form the $n^+$-type regions 109.

Figure 19E:
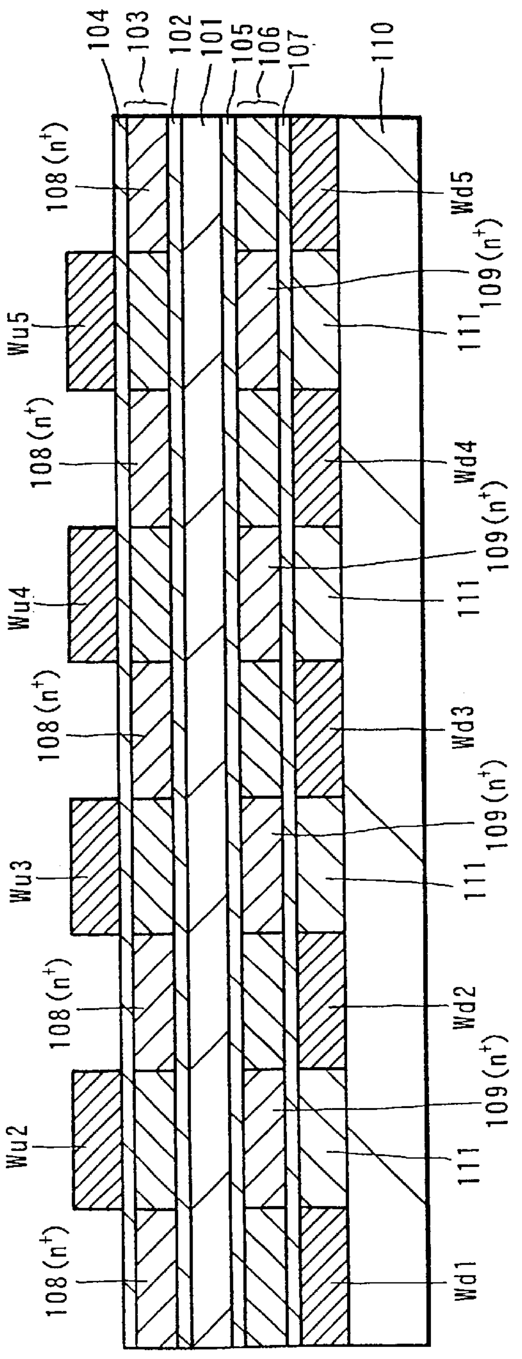

Next as shown in FIG. 19E, after the gate insulating film 105, ferroelectric thin film 101, gate insulating film 102, semiconductor thin film 103 and gate insulating film 104 are sequentially stacked on the semiconductor thin film 106, the word lines Wui are made on the gate insulating film 104 in the same manner as the word line Wdi.

After that, the support substrate 110 and the smoothing film 111 are removed. As a result, as shown in FIGS. 15, 16, 17 and 18, intended NAND type nonvolatile semiconductor memory is obtained.

Next explained is a method of erasure, writing and reading of NAND type nonvolatile semiconductor memory according to the second embodiment.

First concerning to erasure, since writing is active writing using the voltage from a transistor as explained later, no independent process for erasure is necessary, and overwriting is possible.

Figure 20:
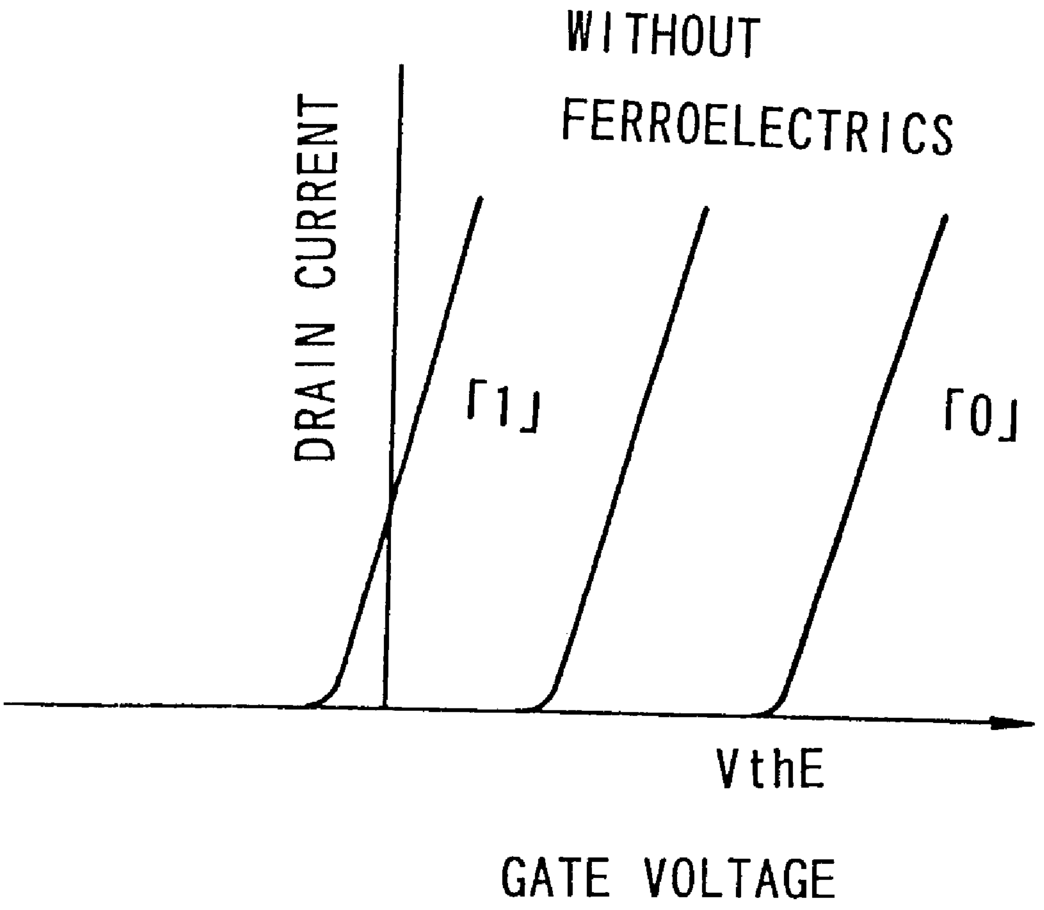
FIG. 20 is a cross-sectional view for explaining a manufacturing method of the NAND type nonvolatile semiconductor memory according to the second embodiment of the invention.
Figure 21:
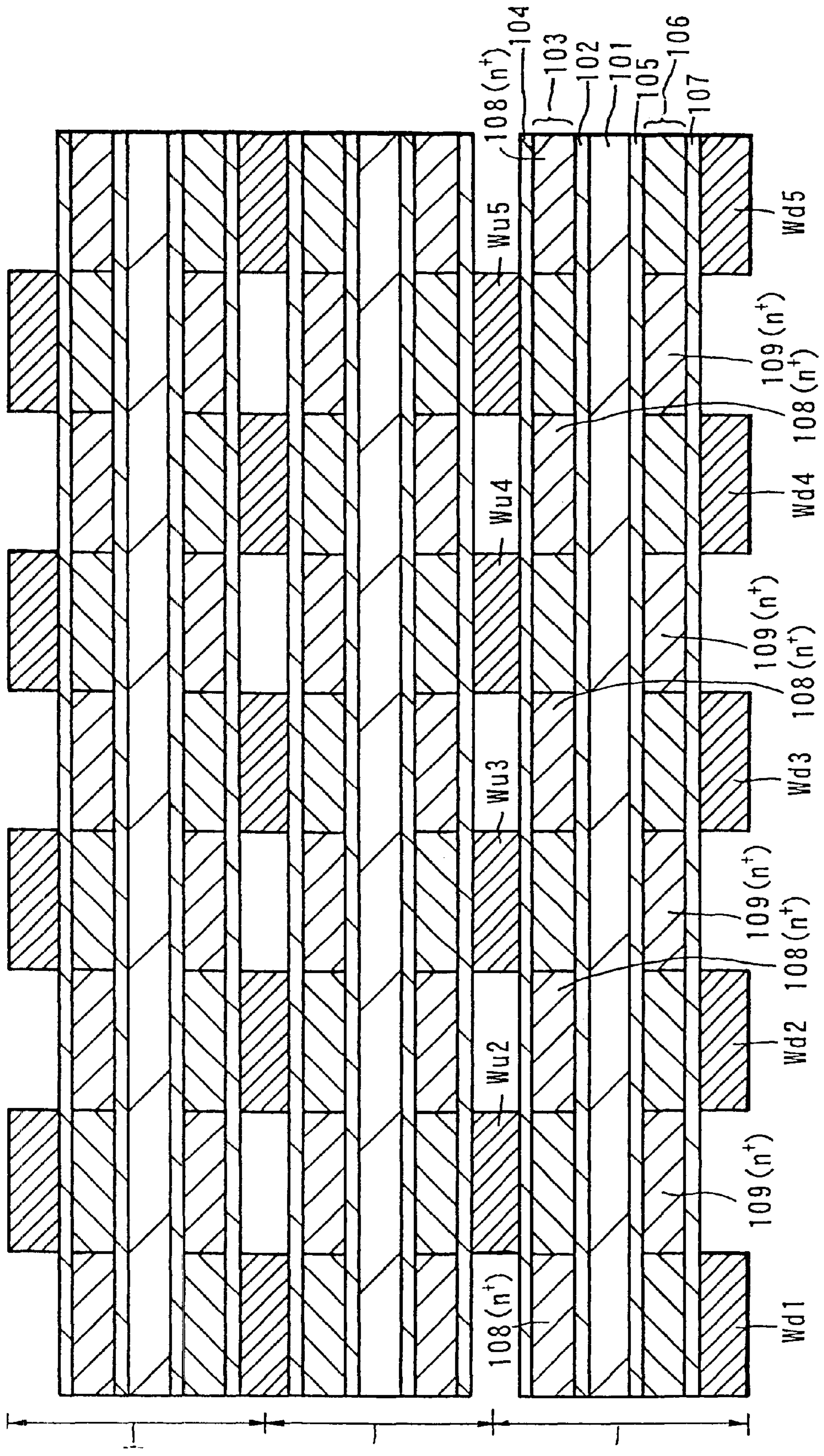
FIG. 21 is a cross-sectional view for explaining a manufacturing method of the NAND type nonvolatile semiconductor memory according to the second embodiment of the invention.

Writing is executed sequentially from the first word line to the nth word line in each memory block. For example, writing is executed from the word line Wu1 to the word line Wun sequentially. It is also possible to execute writing independently in individual memory cells even if they are connected to a common word line. Let the voltage necessary for polarization inversion of the ferroelectrics be $V_w$ (for example, 2.5V). Then, as shown in FIG. 20, the status in which the direction of polarization of the ferroelectrics is oriented toward increasing the threshold voltage of a ferroelectric gate type dual gate thin film transistor forming a memory cell is determined as data "0", and the status with the polarization direction toward decreasing the threshold voltage is determined as data "1".

As an example, assume here that data "1" is to be written in the memory cell MCu1. In this case, a voltage above the threshold voltage is applied to the selection word line WSu1 to turn ON the selection transistor STu1, and the selection line WSd1 is set in 0V to turn OFF the selection transistor STd1. On the other hand, to all of the word lines Wd1~Wdn, a voltage $V_{th}E$ (see FIG. 20) necessary for turning ON the transistors forming the memory cells MCdi (i=1~n) is applied. Then, by applying a voltage above the threshold voltage to the selection line Wsd2 and thereby turning ON the selection transistor STd2, Vw is applied to the bit line Bd. As a result, in the memory cell MCu1, since Vw is applied to the $n^+$-type region 109 lying in a location corresponding to the channel region of the transistor forming this memory cell MCu1, polarization inversion of the ferroelectrics occurs, the threshold voltage of the transistor decreases, and data "1" is written. For writing data "0" in the memory cell MCu1, $-V_w$ is applied to the bit line Bu. In this manner, any data can be written in the memory cell MCu1.

Next made is a review about the process of writing data "1" in the memory cell MCd1. In this case, the selection line WSu1 is set in 0V to turn OFF the selection transistor STu1, and a voltage above the threshold voltage is applied to the selection line WSd1 to turn ON the selection transistor STd1. On the other hand, to all of the word lines Wu1~Wun, the voltage VthE necessary for turning ON the transistors forming the memory cells MCui (i=2~n) is applied. At that time, for the purpose of not applying the inversion voltage to the memory cell MCu1 on the word line Wu1 in which data is already written, −Vth is applied to the word line Wu1 to turn OFF the transistor forming the memory cell MCu1.

Then, by applying a voltage above the threshold voltage to the selection line Wsu2 and thereby turning ON the selection transistor STu2, Vw is applied to the bit line Bu. As a result, in the memory cell MCd1, since Vw is applied to the $n^+$-type region 108 lying in a location corresponding to the channel region of the transistor forming this memory cell MCd1, polarization inversion of the ferroelectrics occurs, the threshold voltage of the transistor decreases, and data "1" is written. For writing data "0" in the memory cell MCd1, $-V_w$ is applied to the bit line Bu. In this manner, any data can be written in the memory cell MCd1.

Thereafter, in the same manner, while turning OFF the transistors of the memory cells already written with data not to change the data, writing of data is progressed for every bit line up to the word lines Wun and Wdn.

By executing writing in this manner, writing with less disturbance is possible although random writing is not possible.

In case of executing writing in any other memory block, the selection transistors STu2 and STd2 are turned OFF to completely prevent disturbance.

Reading is executed in the following manner. For reading out data from memory cells of the memory block connected to the bit line Bu, for example, voltages above the threshold voltages are applied to the selection lines WSu1, WSu2 to turn ON the selection transistors STu1, STu2. For reading out data from the memory cell MCu1, for example, $V_{th}E$ is applied to the word lines Wu2~Wun to turn ON the transistor forming the memory cells MCu2~MCun. Then, by applying a predetermined read-out voltage to the bit line Bu, the source-drain current, i.e. the current flowing in the bit line Bu, is checked. If the current flows therein, data of the memory cell MCu1 is "1". If the current does not flow, data of the memory cell MCu1 is "0". For reading out data from the memory cell MCdn, $V_{th}E$ is applied to the word lines Wd1, Wd3~Wdn−1 to turn on the transistors forming the memory cells MCd1, MCd3~MCdn−1. Then by applying a predetermined read-out voltage to the bit line Bd, the source-drain current, i.e. the current flowing in the bit line Bd, is checked. If the current flows, data of the memory cell MCdn is "1". If the current does not flow, data of the memory cell MCdn is "0".

Thereafter, in the same manner, data can be read from individual memory cells. Thus, in the reading process, random access is possible.

As explained above, according to the second embodiment, by making ferroelectric gate type dual gate thin film transistors on opposite surfaces of the ferroelectric thin film 101 to form memory cells, respectively, connecting a plurality of such memory cells in series to make up a memory block, and arranging a plurality of such memory blocks, it is possible to realize NAND type nonvolatile semiconductor memory of high integration, high speed and low power consumption and alleviated in the problem of disturbance which has been a drawback of conventional ferroelectric gate type nonvolatile memory. Additionally, since this embodiment does not need microminiaturized processing of the ferroelectric thin film 101 for each memory cell individually, the NAND type nonvolatile semiconductor memory can be manufactured easily.

Next explained is NAND type nonvolatile semiconductor memory according to the third embodiment of the invention. FIG. 22 is a cross-sectional view which shows this NAND type nonvolatile semiconductor memory, and it corresponds to FIG. 16.

As shown in FIG. 22, the NAND type nonvolatile semiconductor memory according to the third embodiment is made by stacking three layers of NAND type nonvolatile semiconductor memory structures according to the third embodiment. More specifically, the NAND type nonvolatile semiconductor memory according to the third embodiment stacks, on the NAND type nonvolatile semiconductor memory shown in FIG. 16 (first layer), substantially the same NAND type nonvolatile semiconductor memory upside down (second layer), and further stacks thereon the same NAND type nonvolatile semiconductor memory (third layer) as the first layer NAND type nonvolatile semiconductor memory. Any inter-layer insulating film need not be interposed between every adjacent layers. The NAND type nonvolatile semiconductor memory in the first layer and the NAND type nonvolatile semiconductor memory in the second layer share common word lines Wui. The NAND type nonvolatile semiconductor memory in the second layer and the NAND type nonvolatile semiconductor memory in the third layer share common word lines Wdi.

According to the third embodiment, in addition to the same advantages as those of the second embodiment, its multi-layered structure leads to the further advantage that the integration density is far improved.

Having described specific preferred embodiments of the present invention with reference to the accompanying drawings, it is to be understood that the inventions is not limited to those precise embodiments, and that various changes and modifications may be effected therein by one skilled in the art without departing from the scope or the spirit of the invention as defined in the appended claims.

For example, numerical values, structures, shapes, materials and processes indicated in the above-explained embodiments are not but mere examples, and any other adequate numerical values, structures, shapes, materials and processes can be used, if necessary.

For example, in the first embodiment, the gate insulating film 2 is formed on the semiconductor thin film 1, and the ferroelectric thin film 3 is formed thereon. However, to the contrary, the ferroelectric thin film 3 may be formed on the semiconductor film 1, and the gate insulating film 2 may be formed thereon.

Further, the manufacturing methods of NAND type nonvolatile semiconductor memory explained in combination with the first, second and third embodiments are not but mere examples, and any other appropriate method may be used.

Moreover, in the third embodiment, three layers of NAND type nonvolatile semiconductor memory structure according to the second embodiment are stacked. However, the number of stacked layers is basically free, and two layers, four layers or more layers may be stacked.

As described above, according to the invention, since each memory cell is made of a dual gate transistor connected at one gate portion thereof to ferroelectrics, a plurality of such memory cells are connected in series to form a memory block, and a plurality of such memory blocks are arranged to form a memory cell array, it is possible to realize NAND type nonvolatile semiconductor memory of high integration, high speed, low power consumption and less disturbance.

Further, according to the invention, since thin film transistors are formed on opposite surfaces of a ferroelectric thin film to make memory cells, respectively, a plurality of such memory cells are connected in series to form a memory block, and a plurality of such memory blocks are arranged to form a memory cell array, it is possible to realize NAND type nonvolatile semiconductor memory of high integration, high speed, low power consumption and less disturbance.

What is claimed is:

1. A nonvolatile semiconductor memory characterized in that each memory cell is made of a dual gate transistor in which a ferroelectric thin film is connected to at least one gate portion thereof, a plurality of said memory cells are connected in series to form a memory block, and a plurality of said memory blocks are arranged to form a memory cell array, wherein each said memory block is made by connecting a plurality of said memory cells in series and connecting a selection transistor to at least one end of the serial connection, and wherein each said dual gate transistor is a thin film transistor having a first gate electrode formed on one surface of a semiconductor thin film via a first gate insulating film and the ferroelectric thin film, and a second gate electrode formed on the other surface of said semiconductor thin film via a second gate insulating film in a location opposed to said first gate electrode, each of said dual gate transistors forming each said memory cell is switched by changing the voltage of said second gate electrode.

2. The nonvolatile semiconductor memory according to claim 1 wherein each said memory block is made by connecting a plurality of said memory cells in series and connecting a selection transistor at least one end of the serial connection.

3. The nonvolatile semiconductor memory according to claim 1 wherein one end of each said memory block is connected to a bit line.

4. The nonvolatile semiconductor memory according to claim 1 wherein said dual gate transistors are thin film transistors.

5. The nonvolatile semiconductor memory according to claim 1 wherein said ferroelectric thin film is formed as a continuous film extending over an area of at least a plurality of said memory cells.

6. The nonvolatile semiconductor memory according to claim 1, further including for erasing data from said memory cell.

7. The nonvolatile semiconductor memory according to claim 1, further including means for writing data into said memory cell.

8. The nonvolatile semiconductor memory according to claim 1, further including means for reading out data from said memory cell.

9. The nonvolatile semiconductor memory according to claim 1, further including means for reading out data from said memory cell.

10. The nonvolatile semiconductor memory as set forth in claim 1, further including means for driving said memory cell array.

11. A method for driving nonvolatile semiconductor memory in which each memory cell is made of a dual gate transistor in which ferroelectrics is connected to one of gate portions thereof, a plurality of said memory cells are connected in series to form a memory block, a plurality of said memory blocks are arranged to form a memory cell array, and each said dual gate transistor is a thin film transistor having a first gate electrode formed on one surface of a semiconductor thin film via a first gate insulating film and a ferroelectric thin film, and a second gate electrode formed on the other surface of said semiconductor thin film via a second gate insulating film in a location opposed to said first gate electrode, comprising:

for an erasing operation, uniforming the direction of polarization of said ferroelectric thin film;

for a writing operation, making conduction of said dual gate transistors forming a plurality of the serially connected memory cells of said memory block selected through a selection transistor connected to a bit line by said second gate electrode, and inverting polarization of a part of said ferroelectrics connected to said gate portion of said dual gate transistor forming one of said memory cells at a crossing point of said memory block and a selected word line thereby to write data; and for a read-out operation, making conduction of said dual gate transistors forming memory cells except the selected memory cell of the selected memory block by the selection transistor connected to the bit line by said second gate electrode, and from the bit line current value at that moment, reading the polarization direction of the ferroelectrics connected to the gate portion of said dual gate transistor forming said selected memory cell thereby to read out data.

12. A nonvolatile semiconductor memory characterized in that thin film transistors formed on opposite surfaces of a ferroelectric thin film form memory cells, respectively, a plurality of said memory cells are connected in series to make up a memory block, and a plurality of said memory blocks are arranged to form a memory cell array, wherein a first gate electrode is formed on one surface of said ferroelectric thin film via a first gate insulating film, a first semiconductor thin film and a second gate insulating film; a first semiconductor region forming a source region or a drain region is formed in said first semiconductor thin film at opposite sides of said first gate electrode; a second gate electrode is formed on the other surface of said ferroelectric thin film via a third gate insulating film, a second semiconductor thin film and a fourth gate insulating film; and a second semiconductor region forming a source region or a drain region is formed in said second semiconductor thin film at opposite sides of said second gate electrode, said first semiconductor region formed in said first semiconductor thin film, said first gate electrode and a part of said ferroelectric thin film opposed to said first gate electrode constitute a first ferroelectric gate type dual gate thin film transistor forming said memory cell; and said second semiconductor region formed in said second semiconductor thin film, said second gate electrode and a part of said ferroelectric thin film opposed to said second gate electrode constitute a second ferroelectric gate type dual gate thin film transistor forming said memory cell.

13. The nonvolatile semiconductor memory according to claim 12 wherein each said memory block is made by connecting a plurality of said memory cells in series and connecting a selection transistor at least one end of the serial connection.

14. The nonvolatile semiconductor memory according to claim 12 wherein one end of each said memory block is connected to a bit line.

15. The nonvolatile semiconductor memory according to claim 12 wherein said nonvolatile semiconductor memory is stacked in a plurality of layers to share said first gate electrode or said second gate electrode.

16. The nonvolatile semiconductor memory according to claim 12 wherein said thin film transistor is made by using a polycrystalline Si thin film.

17. The nonvolatile semiconductor memory according to claim 12, further including means for erasing data from said memory cell.

18. The nonvolatile semiconductor memory according to claim 12, further including means for writing data into said memory cell.

19. The nonvolatile semiconductor memory as set forth in claim 12 further including means for driving said memory cell array.

20. A method for driving nonvolatile semiconductor memory in which a first gate electrode is formed on one surface of a ferroelectric thin film via a first gate insulating film, a first semiconductor thin film and a second gate insulating film; a first semiconductor region forming a source region or a drain region is formed in said first semiconductor thin film at opposite sides of said first gate electrode; a second gate electrode is formed on the other surface of said ferroelectric thin film via a third gate insulating film, a second semiconductor thin film and a fourth gate insulating film; and a second semiconductor region forming a source region or a drain region is formed in said second semiconductor thin film at opposite sides of said second gate electrode, said first semiconductor region formed in said first semiconductor thin film, said first gate electrode and a part of said ferroelectric thin film opposed to said first gate electrode constitute a first ferroelectric gate type dual gate thin film transistor forming a first memory cell; and said second semiconductor region formed in said second semiconductor thin film, said second gate electrode and a part of said ferroelectric thin film opposed to said second gate electrode constitute a second ferroelectric gate type dual gate thin film transistor forming a second memory cell, a plurality of said first memory cells are connected in series for form a first memory block; a plurality of said second memory cells are connected in series to form a second memory block; and a plurality of said first memory blocks and a plurality of said second memory blocks are arranged to for a memory cell array, comprising:

for a writing operation, making conduction of said first ferroelectric gate type dual gate thin film transistors forming the serially connected first memory cells of said first memory block selected by a selection transistor connected to a bit line through said first gate electrode; and inverting polarization of a part of said ferroelectrics connected to said gate portion of said second ferroelectric gate type dual gate thin film transistor forming one of said first memory cells at a crossing point of said second memory block and a selected word line thereby to write data; and for a read-out operation, making conduction of said first ferroelectric gate type dual gate thin film transistors forming memory cells other than the selected memory cell of the first memory block selected by a selection transistor connected to a bit line, and reading dual gate transistors forming memory cells except the selected memory cell of the selected memory block by the selection transistor connected to the bit line by said second gate electrode, and from the bit line current value at that moment, reading the polarization direction of the ferroelectrics connected to the gate portion of said first ferroelectric gate type dual gate thin film transistor forming the selected memory cell thereby to read out data.

* * * * *